United States Patent [19]
Tsuji et al.

[11] Patent Number: 4,724,280
[45] Date of Patent: Feb. 9, 1988

[54] PACKAGE FOR INTEGRATED CIRCUIT

[75] Inventors: Kazuto Tsuji; Tsuyoshi Aoki; Michio Ono, all of Kawasaki; Rikio Sugiura, Sagamihara, all of Japan

[73] Assignee: Fujitsu Limited, Kanagawa, Japan

[21] Appl. No.: 894,149

[22] Filed: Aug. 7, 1986

[30] Foreign Application Priority Data

Aug. 10, 1985 [JP] Japan .......................... 60-122952[U]

[51] Int. Cl.[4] .................................... H01L 23/28
[52] U.S. Cl. .................................. 174/52 FP; 357/74
[58] Field of Search ............... 174/52 FP; 357/74; 361/405, 408

[56] References Cited

U.S. PATENT DOCUMENTS 4,089,575  5/1978  Grabbe ........................... 339/17 CF
4,465,898  8/1984  Orcutt et al. ................... 174/52 FP
4,495,376  1/1985  Hightower et al. ............. 174/52 FP

FOREIGN PATENT DOCUMENTS 0074817  3/1983  European Pat. Off. .
0090608  10/1983  European Pat. Off. .
2360174  2/1978  France .

Primary Examiner—Arthur T. Grimley
Assistant Examiner—David A. Tone
Attorney, Agent, or Firm—Armstrong, Nikaido, Marmelstein & Kubovcik

[57] ABSTRACT

PLCC (Plastic Leaded Chip Carrier) for a LSI having protuberances on the bottom along its lateral side, is provided with interconnectors between leg portions of adjacent protuberances. Each interconnector is a swelling from the bottom surface of the main body of PLCC to fill the gap, i.e. a channel, between the protuberances. The height of the filling, namely the height of the interconnector, is lower than that of prior art protuberance to leave some space. This space, a channel, serves as a duct for solvent to flow therein smoothly to and from the narrow gap between the soldered lead and the top of the protuberance and is located adjoining this narrow gap. Therefore, the undesirably remaining flux in this narrow gap is perfectly removed by this smooth flow of the solvent. The leg portion of the protuberance is strengthened by the interconnector so that the occurrence of a crack of the protuberance when the moled PLCC is ejected from the molding cavities is considerably reduced. The structure, using the interconnector, can also avoid using a slanted protuberance having a sharp top which is likely to hurt the fingers of a PLCC handler, or which has too narrow a bottom as a channel for solvent to smoothly flow.

2 Claims, 9 Drawing Figures

PACKAGE FOR INTEGRATED CIRCUIT

BACKGROUND OF INVENTION

1. Field of the Invention

This invention relates to a package for semiconductor integrated circuits. More particularly, this invention relates to an improvement of plastic package for integrated circuits, which is provided with leads bent in the J-shape and extending over protuberances formed on each edge of a bottom side of the enclosure, and generally called PCC (Plastic Chip Carrier) or PLCC (Plastic Leaded Chip Carrier).

2. Description of the Prior Art

In order to meet the increasing demands for mounting LSI (Large Scale Integrated Circuits) at a higher density and at a lower cost on printed circuit boards for electronic equipment, there have been developed many types of packages for LSI. Among these developments, the PLCC is so promising that outlines are standardized by JEDEC (Joint Electron Device Engineering Council) entitled "PLASTIC CHIP CARRIER (PCC) FAMILY 0.050 LEADSPACING, SQUARE, SOLDER MOUNT" (hereinafter referred to as PLCC). These advantages include occupying a small space, being inexpensive, being easy to handle, having low thermal resistance, having a well-matched thermal expansion coefficient to that of the printed circuit board and having stress absorption characteristics due to the J-shaped leads. The structure of the PLCC is schematically illustrated in FIGS. 1 through 3. The main body 11 of the PLCC encapsulating a LSI with plastic resin has a shape of an essentially flat box, which has a relatively wide top and bottom and four relatively low lateral sides. In a strict sense, each lateral side generally consists of an upper-half lateral side 23' and a lower-half lateral side 23. Each half of the lateral side extends from the mid point of the above-described lateral side and is slanted back from a plane 24 of the lateral side by 3° (denoted by U in FIG. 2) toward the top 11-2 and bottom 1101 of the enclosure. The lateral side plane 24 represents each lateral side of the above-mentioned flat box and is orthogonal to the top and bottom of the box. On the bottom surface 11-1 of the flat box, there are provided a plurality of protuberances 17 which are lined up along and parallel to the lateral side. The protuberances are spaced along the lateral side by 1.27 mm, the width of each protuberance along the lateral side is 0.8 mm, the width of the base of each protuberance orthogonal to the above described width is 0.7 mm, the height of the protuberances from the bottom surface 11-1 of the flat box is about 0.6 mm. Each protuberance has a first slope 20 (FIG. 2) coplanar with each slanted lower-half lateral side 23. Each protuberance has a rounded top 21 from the first slope to a second slope 22 which has an angle of approximately 25° (denoted by V in FIG. 2) with respect to each lateral side plane 24. As to the structure of the leads, through the four lateral sides of the flat box, a plurality of electrically conductive leads 12 are extended from the enclosure toward the outside, while the other end of each lead is connected by a bonding wire 14 to the corresponding terminal pad of the LSI 13 encapsulated in the main body 11. Material of the leads is copper alloy having good thermal conductivity. Immediately after extending out of the lateral side, each lead is bent and extends along approximately parallel to each lateral side toward the bottom of the box. Each lead then extends along and curves like a J-shape around its associated protuberance toward the bottom 11-1 of the box. There is a second type of PLCC as an optional variation of the above described first type. The difference between the second type and the first type is that the gaps 18 between the prior art protuberances 17 are fully filled with the same plastic material to form a continuous bank 17' of a uniform height along each lateral side as shown in FIG. 6. Details of the PLCC are also disclosed in U.S. Pat. No. 4,465,898 entitled "Carrier for Integrated Circuit," John W. Orcutt, et al. issued on Aug. 14, 1984 and U.S. Pat. No. 4,495,376 entitled "Carrier for Integrated Circuit," Angus W. Hightower, et al. issued on Jan. 22, 1985.

Soldering of a PLCC onto a printed circuit board 10 is typically done by a reflow method, which has been widely used in the electronic industry. The reflow method is as follows: Solder-paste (mixture of powdered solder, soldering flux and binder) is printed on the specific portions of printed copper leads 16 by a silk screen method. Many types of the solder-paste are available on the market. Among them, solder of 63Sn-37Pb alloy is the most popularly used. As for the flux, a rosin type is typically used. To control clearing chlorine contents in the flux, MILRMA type is preferably used. The thickness of the printed solder paste is generally 200-300 microns. A PLCC is placed on a printed circuit board for each roundly formed lead of the PLCC to sit exactly on each corresponding deposit of printed solder-paste. The printed circuit board, carrying the pasted PLCC thereon, is heated by a heating means, such as an infrared lamp or vapor-phase. The printed circuit board is heated enough for the solder paste to melt, for example 200°-235° C. for 40 sec maximum if infrared lamp heating is used. The printed circuit board, the PLCC and the melted solder are cooled to solidify the solder. The solidified solder is denoted by 15 in FIG. 1.

Next, in order to remove undesirably remaining flux on the printed circuit board and the PLCC, they are washed by dipping or boiling in a solvent, such as trichloroethylene, freon, etc. If removal of the flux is not sufficient, the remaining flux may corrode the leads 16 of printed circuit board or the leads 12 of the PLCC resulting in its disconnection. The leads are made of copper or copper alloy either of which is very susceptible to the acid in the flux. Therefore, the leads must be completely washed. However, a gap 25 between the curved lead and the associated protuberance is located just behind the soldered portion 15 of the lead and the flux is likely to enter there even though the gap is narrow, because the flux is likely to splash there due to exploding caused by the heat from soldering. Therefore, the first type of PLCC is provided with gaps, i.e. channels 18 between protuberances as the path for the flowing solvent so that the solvent can smoothly flow to and from the soldered portion 15, and the adjoining narrow gap 25. Therefore, as to the first type of PLCC, there is no problem in removing the flux.

However, there are some problems in the prior art types of PLCC. One problem with the first type of PLCC is that the protuberances are so thin in width that they are easy to break, because during the ejection of the hardened plastic resin from the molding cavities there may be produced a chip or crack on the protuberance. In particular, many of the PLCCs are processed for plastic molding at the same time in order to improve production efficiency. Side walls 23 of the protuberances 17 which face each other are parallel and orthogonal to the bottom surface 11-1 of the PLCC (FIG. 4) where 31 denotes a molding cavity. Therefore, if all the molded PLCCs are ejected exactly parallel along the side walls 23 from the mold cavities 31, no lateral stress is imposed against the side walls 23 of the protuberance 17. However, in practice, some non-parallel motion of ejection of the PLCCs from the cavities is unavoidable and this non-parallel motion causes the above-described lateral stress against the side walls of the protuberances. This lateral stress may cause a crack in the protuberance. In order to ease this lateral stress in the parallel wall 23, the parallel wall 23 of each protuberance can be slanted as shown by the dotted lines in FIG. 5 where 31' denotes a molding cavity. However, if the slanted walls are designed to provide a relatively wide bottom portion of the channel 18, the slanted walls are likely to have a sharp edge at the top of the protuberance as shown by the dotted lines A, allowing the sharp top to crack easily and which can easily hurt the fingers of a handler. If the slanted walls are designed to provide a relatively wide top of the protuberance, the slanted walls are likely to make the bottom of the channel 18 narrow as shown by the dotted lines B. Therefore the flux remaining in the channel can not be easily removed. Summing up the problems described above about the first type of PLCC, determination of the shape of the protuberance is very delicate and difficult.

A problem with the second type of PLCC, in which the channel 18 between adjacent protuberances 17 is fully filled in order to strengthen the breakable weak protuberances, is that the solvent can not smoothly flow to and from the flux remaining in the gap 25 (FIG. 6) which is about 70 microns between the curved lead and the top 25 of the protuberance 17'. Thus, the remaining flux can not be completely removed. Therefore, a PLCC having a structure satisfying the requirements of both mechanical strength of the protuberances and completeness of flux removal has been seriously in demand.

SUMMARY OF THE INVENTION

It is a general object of the present invention to provide a PLCC having protuberances which are mechanically strong while enabling solvent to remove remaining flux completely.

It is another object of the present invention to provide a PLCC having protuberances which are not dangerous to a handler of the PLCC.

The present invention provides a PLCC having protuberances each of which is connected to an adjacent protuberance by an interconnector which is swelling out of the bottom surface of the enclosure of PLCC but having a height which is lower than that of the protuberance. The height, the portion of the swelling, is preferably one third to two thirds of that of the prior art protuberances. The interconnector is made of the same plastic material as the main body of the enclosure and is molded at the same time of the injection molding of the enclosure. According to the prior art structure of the protuberance, the leg portion of the protuberance, the portion adjoining the bottom surface of the main body, is the place where the lateral stress caused by the non-parallel motion of ejection is largest and therefore is the most likely spot to be broken. However according to the structure of the present invention, this weak portion is strengthened by the interconnector and also no stress is imposed thereon. The area of the parallel wall left to define the channel by the interconnector is smaller in height. This means the parallel wall of the protuberances of the present invention receives less lateral stress, and thus it is less likely to break. The top of the protuberance is not sharp, so there is no danger of hurting the fingers of the handlers. The space left by the interconnector, the channel between adjacent protuberances, can serve as a duct for solvent to flow therethrough to and from the narrow gap, in which the solder flux remains, such as the 70 micron gap between the curved lead and the associated protuberance.

The above-mentioned features and advantages of the present invention, together with other objects and advantages which will become apparent, will be more fully described hereinafter.

DESCRIPTION OF THE PREFERRED EMBODIMENT

Figure 1:
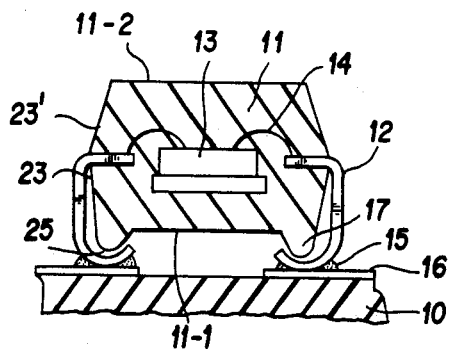
FIG. 1 schematically illustrates a cross-sectional side view of a PLCC soldered on a printed circuit board.
Figure 2:
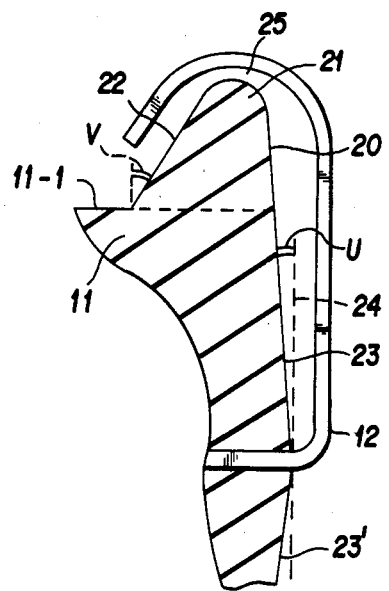
FIG. 2 schematically illustrates a cross-sectional side view of a protuberance and its associated lead, on a enlarged scale.
Figure 3:
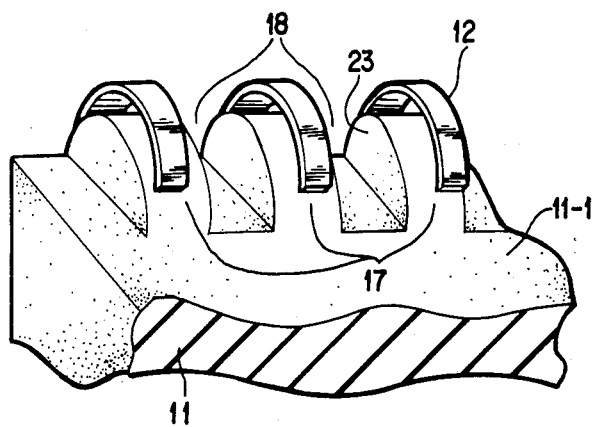
FIG. 3 schematically illustrates an enlarged partial perspective view of the leads and their associated protuberances of the prior art PLCC.
Figure 4:
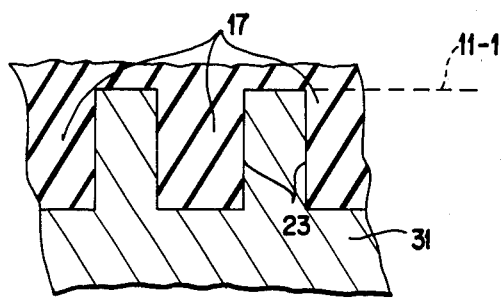
FIG. 4. schematically illustrates an enlarged partial sectional side view of the protuberances and the associated cavity of injection mold for the prior art PLCC.
Figure 5:
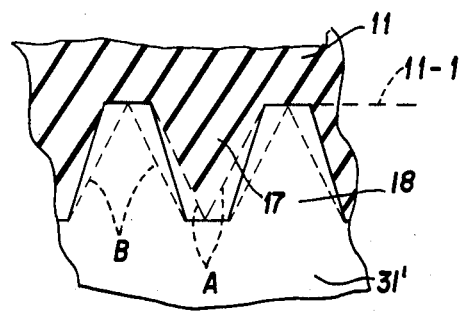
FIG. 5. schematically illustrates an enlarged partial sectional view to explain the slanted walls of the protuberances of the prior art PLCC.
Figure 6:
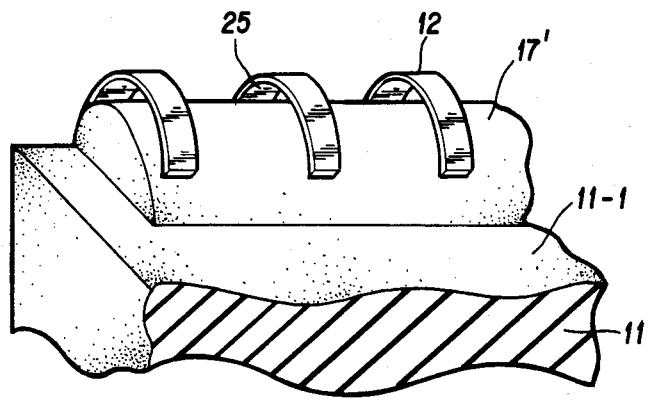
FIG. 6. schematically illustrates an enlarged partial perspective view of the prior art PLCC having continuous protuberance.
Figure 7:
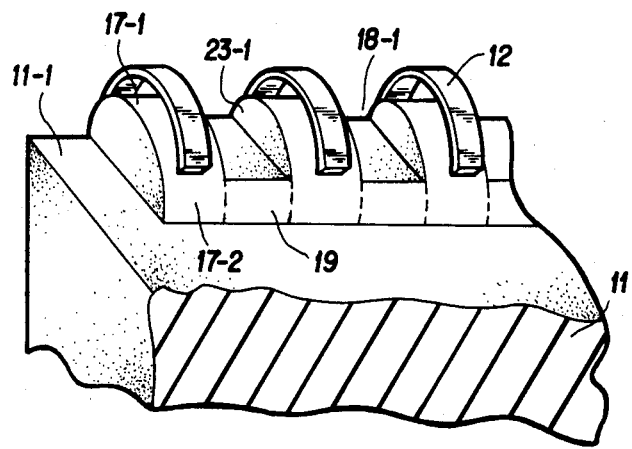
FIG. 7. schematically illustrates an enlarged partial perspective view of the protuberances and their associated leads of the PLCC of the present invention.
Figure 8:
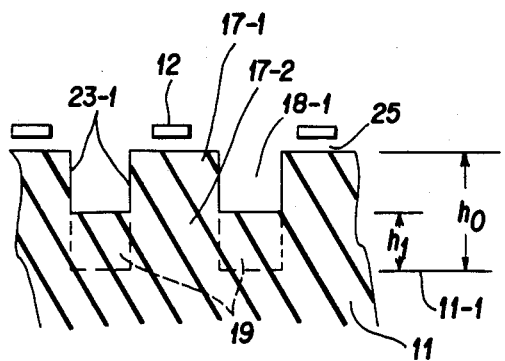
FIG. 8 schematically illustrates an enlarged sectional view of protuberances and their interconnector cut by a plane vertically crossing the tops of the protuberances of FIG. 7.

Approximately one half of the height $h_o$ of the prior art protuberances 17, of the leg portions 17-2 of the protuberances are connected by interconnectors 19 as shown in FIGS. 7 and 8. The height of the interconnector 19 from the bottom surface 11-1 of the main body 11 is denoted by $h_1$ in FIG. 8. The height $h_1$ is generally chosen $\frac{1}{3}$ to $\frac{2}{3}$ of the height $h_o$ of the prior art protuberance 17. The dotted lines in FIGS. 7 and 8 indicate the border lines between newly provided interconnectors 19 and the leg portion 17-2 of the prior art protuberances 17 for ease in explanation, although no border line is really found on the PLCC of the present invention. The slope of the outer side of the interconnectors 19 is coplanar with the slope 20 (FIG. 2) of the outer side of the leg portion 17-2 (FIG. 7) of the protuberances. The slope of the inner side of the interconnectors 19 is coplanar with the slope 22 (FIG. 2) of the inner side of the leg portion 17-2 (FIG. 7) of the protuberances. The interconnectors 19, the protuberances 17-1, 17-2 and the main body 11 of the PLCC enclosure are homogeneously made of the plastic resin injected, hardened and ejected in a similar-to-conventional type of molding cavities at the same time by the same method as that of the prior art. The weak leg portions 17-2 of the prior art protuberances are strengthened by the interconnectors 19. The side wall 23-1 of the protuberances 17-1 which face each other of the present invention is smaller in height and in area than those of the prior art protuberances. Therefore, the molded protuberances have a shallow depth into the corresponding cavities. Thus, the undesirable lateral stress orthogonally against these side walls caused by the non parallel motion of ejection of the molded PLCC from the molding cavities is less than that of the prior art protuberances. Thus, the probability of breakage of the protuberances is considerably reduced. The edge of the top of the protuberance 17-1 is no less than 90°. Therefore, there is no anticipated danger in having the fingers of the handlers hurt at the production process of the PLCC. The space 18-1, a channel which is the rest portion of the interconnector 19 between the protuberances 17-1, can serve as a duct for solvent to flow therein to and from the narrow portion, such as the 70 micron gap 25 between the curved lead and the protuberance, so that the solvent can completely remove the undesirable flux remaining thereon. Washing of the soldered printed circuit board is done by boiling or dipping in a bath of the solvent. The space, the channel, 18-1 left by the interconnector 19 is located adjoining this narrow gap 25 between the top 21 of the protuberance and the curved lead wherefrom the removal of the flux has not been easy. Therefore, this channel 18-1 is very effective and necessary for having a smooth flow of the solvent to and from the portions in which it is difficult to remove the remaining flux.

Figure 9:
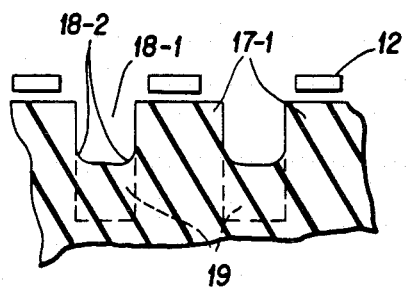
FIG. 9. schematically illustrates another embodiment of the present invention.

The corners 18-2 of the channel 18-1 at the connection point of the interconnector 19 and the protuberance 17-1 can be shaped round as shown in FIG. 9 as another embodiment of the present invention. Though it was described that the lateral stress caused by non-parallel ejection is reduced, this corner is a delicate place where the stress is concentrated and therefore it is still possible to crack the corner even though the probability is very small. This corner end of the channel 18-1 does not fully contribute to the flow of the solvent. Rather the corner has been a place where the remaining flux is not easily removed. Therefore, the channel having a rounded corner is advantageous to provide a stronger protuberance without sacrificing the smooth flow of the solvent.

The many features and advantages of the invention are apparent from the detailed specification and thus, it is intended by the appended claims to cover all such features and advantages of the system which fall within the true spirit of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the claims.

What we claim is:

1. A package encapsulating an integrated circuit comprising:
    (a) an enclosure having said integrated circuit located therein, said enclosure having a top, bottom, and four lateral sides, said bottom side being provided with a plurality of protuberances, said protuberances being aligned along each lateral side, and being spaced from and connected to adjacent protuberances by an interconnector by a predetermined distance, said interconnector being made of the same material as said enclosure, said interconnector swelling out of said bottom side and having a height less than the height of said protuberances measured from said bottom side; and
    (b) a plurality of leads, a first end of each lead being connected to a terminal pad of said integrated circuit encapsulated in said enclosure, a second end of each lead extending through said each lateral side and further along said lateral side toward said bottom, and each of said second ends further extending over and curving around each of said protuberances toward each said bottom side.
2. A package encapsulating an integrated circuit according to claim 1, wherein said height of said interconnector is higher than one third but lower than two thirds of said height of said protuberances measured from said bottom side.

* * * * *